United States Patent [19]

Walker

[11] Patent Number: 4,877,982
[45] Date of Patent: Oct. 31, 1989

[54] MOSFET TURN-ON/OFF CIRCUIT

[75] Inventor: Charles S. Walker, Seattle, Wash.

[73] Assignee: Honeywell Inc., Minneapolis, Minn.

[21] Appl. No.: 299,508

[22] Filed: Jan. 23, 1989

[51] Int. Cl.[4] ........................................... H03K 17/687
[52] U.S. Cl. ..................................... 307/571; 307/570; 307/270; 307/246; 307/584
[58] Field of Search ......................... 307/570, 571–575, 307/246, 584, 310, 304, 549, 270

[56] References Cited

U.S. PATENT DOCUMENTS

| 4,445,055 | 4/1984 | Bete | 307/571 |
| 4,471,245 | 9/1984 | Janutka | 307/571 |
| 4,677,324 | 6/1987 | Ronan, Jr. et al. | 307/571 |

FOREIGN PATENT DOCUMENTS

| 0206482 | 12/1986 | European Pat. Off. | 307/575 |
| 2935541 | 12/1980 | Fed. Rep. of Germany | 307/570 |
| 0069211 | 4/1986 | Japan | 307/571 |

Primary Examiner—Stanley D. Miller
Assistant Examiner—Nancy Thai
Attorney, Agent, or Firm—Whitham & Marhoefer

[57] ABSTRACT

A dual current source MOSFET turn-on/off circuit includes a high gain PNP transistor as a turn-off current source and a high gain NPN transistor as a turn-on current source for a P-channel MOSFET. A switch in the base circuit of the NPN transistor turns on the NPN transistor current source which overpowers the PNP transistor current source. The net current charges the MOSFET gate-to-source capacitance which, upon reaching a threshold voltage, turns the MOSFET on. When the switch is opened, the PNP transistor current source discharges the gate-to-source capacitance, turning off the MOSFET. The circuit provides almost constant power dissipation independent of input voltage and a constant turn-on/off time independent of input voltage.

5 Claims, 3 Drawing Sheets

TABLE I

CIRCUIT COMPARISONS

| QUANTITY | CONDITIONS | DUAL CURRENT SOURCE CIRCUIT | CONVENTIONAL CIRCUIT |
|---|---|---|---|
| TOTAL TURN-ON/OFF CIRCUIT POWER DISSIPATION | MIN. INPUT VOLTAGE<br>NOM. INPUT VOLTAGE<br>MAX. INPUT VOLTAGE | 1.40W<br>1.42W<br>1.45W | 1.21W<br>2.5W<br>3.1W |
| MOSFET $Q_1$ TURN-OFF TIME | MIN. VGS THRESHOLD<br>NOM. VGS THRESHOLD<br>MAX. VGS THRESHOLD | 0.73 USEC<br>1.0 USEC<br>1.45 USEC | 0.6 USEC<br>1.0 USEC<br>1.8 USEC |
| MOSFET $Q_1$ TURN-ON TIME | MIN. INPUT VOLTAGE<br>NOM. INPUT VOLTAGE<br>MAX. INPUT VOLTAGE | 1.0 USEC<br>1.0 USEC<br>1.0 USEC | 1.0 USEC<br>0.33 USEC<br>0.25 USEC |
| WORST CASE TURN-ON TIMES FOR MIN./MAX. THRESHOLDS & MIN./MAX. INPUT VOLTAGES | MIN<br>MAX<br>RATIO | 0.73 USEC<br>1.45 USEC<br>2:1 | 0.2 USEC<br>1.2 USEC<br>6:1 |

MOSFET TURN-ON/OFF CIRCUIT

The Federal Government has rights in the invention disclosed herein pursuant to contract No. N00024-85-C-6098, awarded by the Department of Navy.

BACKGROUND OF THE INVENTION

1. Field of the Invention

This invention generally relates to current switching amplifier inverters and, more particularly, to an improved dual current source MOSFET turn-on/off circuit for use in such inverters.

2. Description of the Prior Art

The P-channel MOSFET (metal oxide semiconductor field effect transistor) with its high gate threshold voltage (on the order of 2 to 4 volts), fast turn on/off times and polarity makes an ideal component for pulse width modulated switching regulators. A typical application is shown in FIG. 1A. In this circuit, the P-channel MOSFET $Q_1$ acts as a high-speed switch to modulate the voltage appearing on the catch diode $CR_1$ and inductor $L_1$. This voltage is either $V_{in}$ or zero. Closing switch $SW_1$ turns on N-channel MOSFET $Q_2$ which, in turn, turns on $Q_1$. The output voltage, $V_o$, is equal to the "on" time, $T_1$, divided by the total period, $T_t$, times the input voltage (neglecting losses), as shown in FIG. 1B.

This circuit, while having the very nice advantage of not requiring a bias supply at the $+V_{in}$ potential to control $Q_1$, has three undesirable features: First, power dissipation increases as $V_{in}$ increases. Second, turn-on time decreases as $V_{in}$ increases, producing a compounding effect on circuit noise increases caused by faster rise times and larger voltage excursions. Third, $V_{in}$ must exceed a large threshold to get any output.

A bias supply and other circuitry at the $+V_{in}$-to-zero potential to control $Q_1$ is required if an N-channel MOSFET is used as shown in the circuit of FIG. 2. Obvious design complications aside, this configuration greatly increases the circuit noise because point P (and the entire turn-on/off circuit) swings up and down between O and $+V_{in}$ at the chopping rate.

SUMMARY OF THE INVENTION

It is therefore an object of the present invention to provide an improved MOSFET turn-on/off circuit which exhibits a turn-on time independent of the input voltage.

It is another object of the invention to provide a MOSFET turn-on/off circuit wherein power dissipation remains substantially constant as the input voltage increases.

According to a preferred embodiment of the invention, a dual current source MOSFET turn-on/off circuit is provided. The circuit includes a high gain PNP transistor as a turn-off current source and a high gain NPN transistor as a turn-on current source for a P-channel MOSFET. A switch in the base circuit of the NPN transistor turns on the NPN transistor current source which overpowers the PNP transistor current source. The net current charges the MOSFET gate-to-source capacitance which, upon reaching a threshold voltage, turns the MOSFET on. When the switch is opened, the PNP transistor current source discharges the gate-to-source capacitance, turning off the MOSFET.

BRIEF DESCRIPTION OF THE DRAWINGS

The foregoing and other objects, aspects and advantages of the invention will be better understood from the following detailed description of a preferred embodiment of the invention with reference to the drawings, in which:

FIG. 4 is a table showing operational comparisons between the circuit according to the invention and a conventional circuit.

DETAILED DESCRIPTION OF A PREFERRED EMBODIMENT OF THE INVENTION

Figure 3:
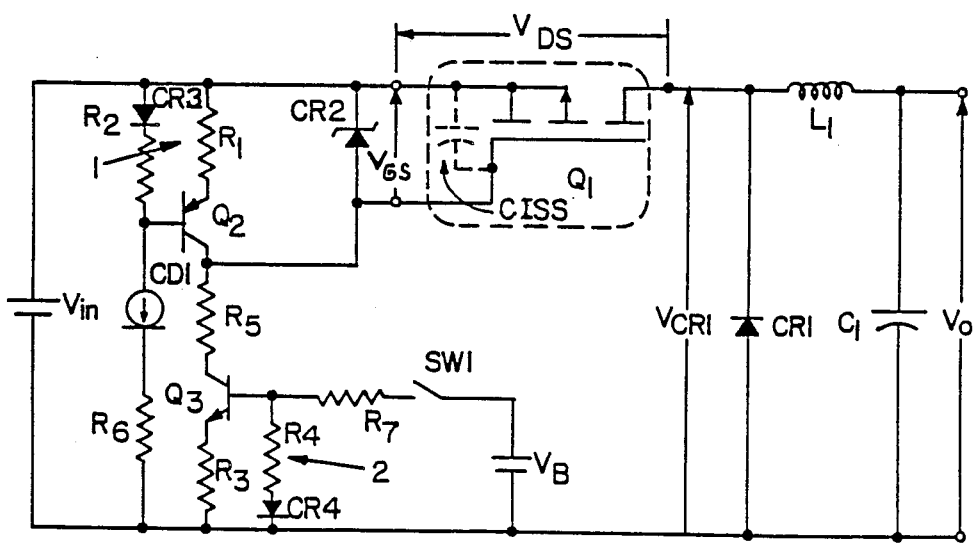
FIG. 3 is a schematic diagram showing an implementation of a pulse-width modulator according to the principles of the invention.

Referring now to the drawings, and more particularly to FIG. 3, there is shown a pulse-width modulator in which a dual current source is used to control a P-channel MOSFET switch $Q_1$. The circuit includes a turn-off current generator 1 and a turn-on current generator 2. The turn-off current generator 1 comprises a resistor $R_2$ which, with diode $CR_3$, sets the base potential of PNP transistor $Q_2$. Diode $CR_3$ provides approximately 0.6 V drop and a negative temperature coefficient ($\cong -2$ mV/°C.) to offset similar quantities in transistor $Q_2$. A current regulator diode $CD_1$ provides a constant current for resistor $R_2$ and diode $CR_3$. An optional resistor, $R_6$, may be connected in series with diode $CD_1$ to share the power loss with that diode. A dropping resistor, $R_1$, in the emitter circuit of transistor $Q_2$ sets the turn-off current level $i_{toff}=V_{R2}/R_1$. A Zener diode $CR_2$ limits the gate-to-source voltage of transistor $Q_1$ to approximately 8V.

The turn-on current generator 2 comprises an NPN transistor $Q_3$ having its collector connected to the collector of transistor $Q_2$ via an optional resistor $R_5$ which may be added to share the power loss with transistor $Q_3$. Resistor $R_4$, with bias voltage $V_B$ and resistor $R_7$, set the base potential of transistor $Q_3$. Resistor $R_7$ could be a current reference diode if $V_B$ is not a fixed voltage. Diode $CR_4$ provides a similar voltage drop and temperature coefficient function for transistor $Q_3$ as that provided by diode $CR_3$ for transistor $Q_2$. The emitter resistor, $R_3$, determines the turn-on current for transistor $Q_3$ in the same way as resistor $R_1$ does for transistor $Q_2$.

The high gain PNP transistor $Q_2$ and high gain NPN transistor $Q_3$ provide almost ideal current sources. Closing switch $SW_1$ turns on current source 2 which overpowers current source 1. The net current charges MOSFET $Q_1$ gate-to-source capacitance, $C_{iss}$, which, upon reaching the 2 to 4 volt threshold, turns on $Q_1$. When switch $SW_1$ is opened, current source 1 discharges $C_{iss}$ turning off $Q_1$.

Figure 1B:
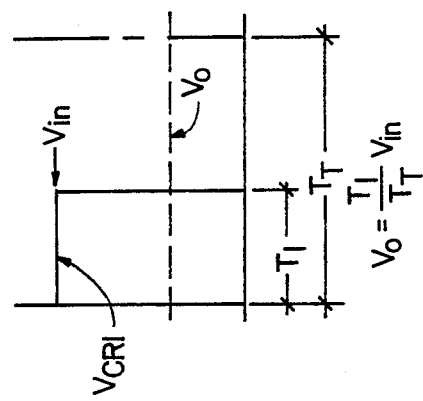
FIG. 1B is a timing diagram illustrating the operation of the circuit of FIG. 1A.
Figure 1A:
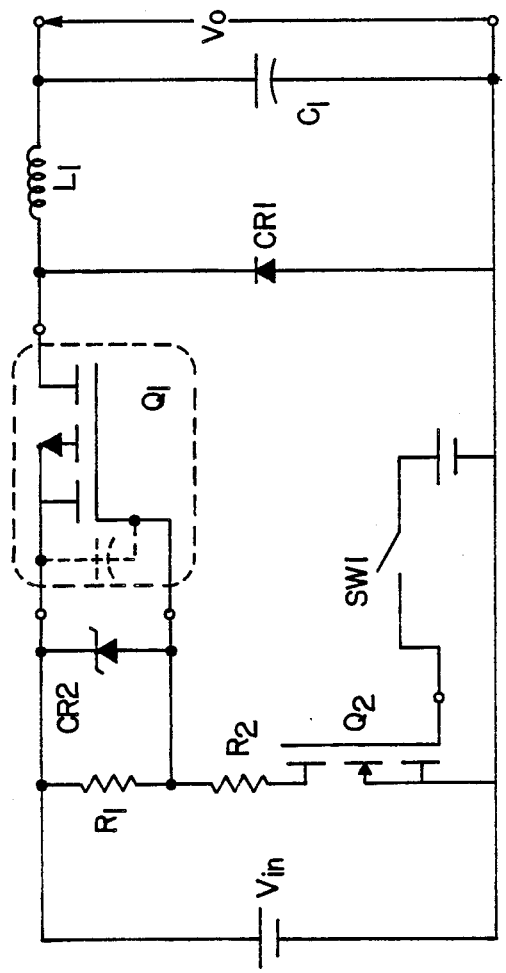
FIG. 1A is a schematic diagram showing a conventional pulse-width modulator using a P-channel MOSFET switch.
Figure 2:
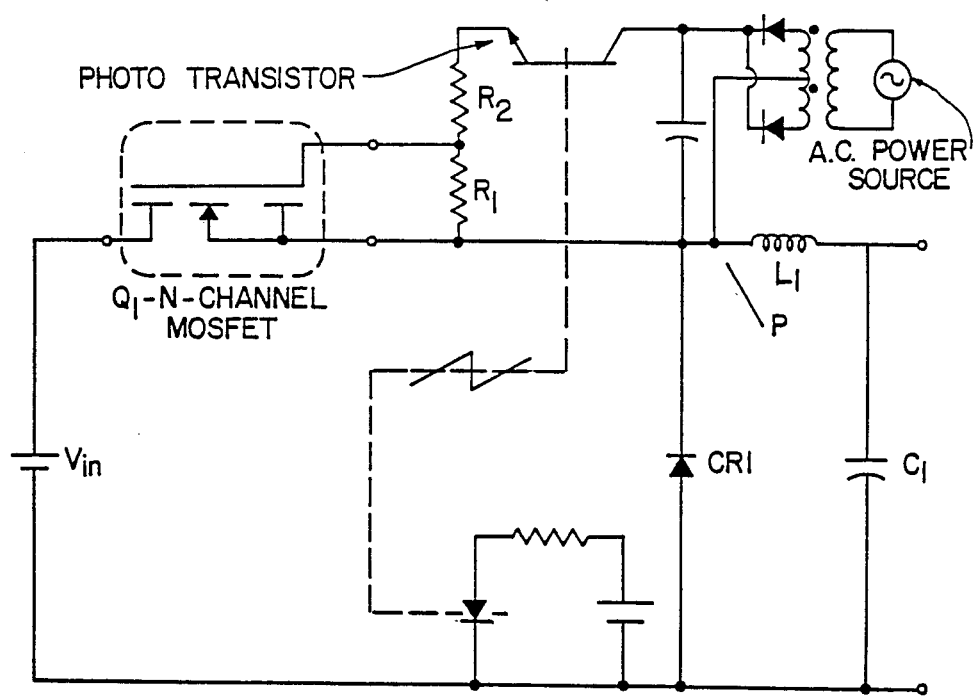
FIG. 2 is a schematic diagram showing a conventional pulse-width modulator using an N-channel MOSFET switch.

The circuit shown in FIG. 3 has several advantages. There is almost constant power dissipation independent of $V_{in}$. The turn-off/on time is constant and independent of $V_{in}$ for a particular MOSFET $Q_1$. Further, the $V_{in}$ threshold to get an output can be greatly reduced over the prior art. If resistors $R_5$ and $R_6$ are removed (thereby increasing the heat load on diode $CD_1$ and transistor $Q_3$ somewhat), outputs could be achieved for $V_{in}$ voltage levels as low as approximately 7 volts; one volt for resistor $R_3$ and approximately 6 volts for source-to-gate voltage $Q_1$. Table I in FIG. 4 summarizes the circuit comparisons between the dual current source circuit of FIG. 3 and the conventional circuit of FIG. 1. The invention described above provides a positive output voltage source. If a negative output voltage source is desired, this can be achieved using an N-channel MOSFET in place of the P-channel MOSFET shown and NPN bipolar transistors in place of PNP transistors, as is well understood in the art.

While the invention has been described in terms of a preferred embodiment, those skilled in the art will recognize that the invention can be practiced with modification within the spirit and scope of the appended claims.

Having thus described my invention, what I claim as new and desire to secure by Letters Patent is as follows:

1. A dual current source MOSFET turn-on/off circuit comprising:
   a MOSFET connected between a voltage source and a load;
   a turn-off current source comprising a first high gain bipolar transistor connected to a gate electrode of said MOSFET;
   a turn-on current source comprising a second high gain bipolar transistor connected in series with said first bipolar transistor; and
   switch means connected to a base electrode of said second bipolar transistor for turning said second bipolar transistor on and off, said turn-on current source overpowering said turn-off current source when said second bipolar transistor is turned on to charge a gate-to-source capacitance of said MOSFET and said turn-off current source discharging said gate-to-source capacitance of said MOSFET when said second bipolar transistor is turned off.

2. The dual current source MOSFET turn-on/off circuit according to claim 1 wherein said turn-off current source comprises:
   base bias means connected to a base electrode of said first bipolar transistor for setting a base potential and providing temperature compensation for said first bipolar transistor; and
   means connected to an emitter electrode of said first bipolar transistor for setting a turn-off current level of said first bipolar transistor.

3. The dual current source MOSFET turn-on/off circuit according to claim 1 wherein said turn-on current source comprises:
   base bias means connected to a base electrode of said second bipolar transistor for setting a base potential and providing temperature compensation for said second bipolar transistor; and
   means connected to an emitter electrode of said second bipolar transistor for setting a turn-on current level of said second bipolar transistor.

4. The dual current source MOSFET turn-on/off circuit according to claim 1 wherein said turn-off current source comprises:
   base bias means connected to a base electrode of said first bipolar transistor for setting a base potential and providing temperature compensation for said first bipolar transistor; and
   means connected to an emitter electrode of said first bipolar transistor for setting a turn-off current level of said first bipolar transistor;
   and wherein said turn-on current source comprises:
   base bias means connected to a base electrode of said second bipolar transistor for setting a base potential and providing temperature compensation for said second bipolar transistor; and
   means connected to an emitter electrode of said second bipolar transistor for setting a turn-on current level of said second bipolar transistor.

5. The dual current source MOSFET turn-on/off circuit according to claim 4 wherein said MOSFET is a P-channel MOSFET, said first bipolar transistor is a PNP transistor, and said second bipolar transistor is an NPN transistor.

* * * * *